United States Patent [19]
Ippommatsu et al.

[11] Patent Number: 5,348,776
[45] Date of Patent: Sep. 20, 1994

[54] METHOD OF PRODUCING INTERCONNECTORS FOR SOLID OXIDE ELECTROLYTE FUEL CELLS

[75] Inventors: Masamichi Ippommatsu, Hyogo; Hirokazu Sasaki, Osaka; Shoji Otoshi, Osaka; Minoru Suzuki, Osaka; Atsuko Kajimura, Osaka, all of Japan

[73] Assignee: Osaka Gas Company Limited, Osaka, Japan

[21] Appl. No.: 867,933

[22] Filed: Apr. 13, 1992

[30] Foreign Application Priority Data

Apr. 23, 1991 [JP] Japan ................... 3-092353

[51] Int. Cl.$^5$ ............................. B05D 5/12
[52] U.S. Cl. .................. 427/586; 427/115; 427/126.3; 427/248.1; 427/314; 427/596
[58] Field of Search .......... 427/596, 115, 126.3, 427/248.1, 314, 586

[56] References Cited

U.S. PATENT DOCUMENTS 3,560,258  2/1971  Brisbane ..................... 117/212

FOREIGN PATENT DOCUMENTS 355420   2/1990  European Pat. Off. .
361383   4/1990  European Pat. Off. .
2087472  3/1990  Japan .
2227961  9/1990  Japan .
2288160  11/1990 Japan .
4022622  1/1992  Japan .

OTHER PUBLICATIONS

"Growth Mechanism of Perovskite Films by Electrochemical Vapor Deposition", by U. B. Pal et al, Presented at the Sixth (IUPAC) International Conference on High Temperature Chemistry of Inorganic Materials, Gaithersburg, Maryland., Apr. 3-7, 1989.
Proceedings of the International Fuel Cell Conference, Feb. 3-6, 1992, pp. I-XIX and 290-292.
Proceedings of the International Conference on Advanced Materials, Spring 1991, pp. V-XXIV and 561-566.
English translation of an extract from "Formation of Fuctional Ceramic Thin Films by a Laser Ablation Method", Bulletin of the Ceramic Society of Japan, Vol. 25, No. 10, (1990), pp. 954-958.
"Solid Oxide Fuel Cells—The Next Stage" by Brian Riley, Journal of Power Sources, Jan. 1990, pp. 223-237, vol. 29 No. 1.
Proc. of the Electrochem. Soc. (Proc. of the First Intern. Symp. on Solid Oxide Fuel Cells) Oct. 16-18, 1989, Pennington, pp. 387-393, Tetsuo Yazawa "Present State of SOFC in Japan".

*Primary Examiner*—Bernard Pianalto
*Attorney, Agent, or Firm*—Jordan and Hamburg

[57] ABSTRACT

The invention relates to a method of producing interconnectors for solid oxide electrolyte fuel cells (SOFC). The method of the invention is characterized in that a compact thin film to serve as an interconnector is formed on a substrate by the laser ablation method. By this method, interconnectors made of a compact thin film highly accurate in composition can be produced with high productivity.

7 Claims, 2 Drawing Sheets

METHOD OF PRODUCING INTERCONNECTORS FOR SOLID OXIDE ELECTROLYTE FUEL CELLS

BACKGROUND OF THE INVENTION

This invention relates to a method of producing interconnectors for solid oxide electrolyte fuel cells (SOFC).

In the manufacture of solid oxide electrolyte fuel cells, interconnector fabrication is one of the most important and troublesome processes. Interconnectors for solid oxide electrolyte fuel cells must have stable and sufficient electronic conductivity in a wide range of partial pressure of oxygen from the air electrode side to the fuel electrode side, show a coefficient of thermal expansion which is substantially equal to that of the electrolyte material (e.g. yttria-stabilized zirconia (YSZ)), and be unreactive with other cell constituent materials even at 1,273K. Owing to such severe requirements, alkaline earth metal-doped $LaCrO_x$ (lanthanum chromium (III) oxide) type oxides are generally used as interconnector materials. However, it is difficult to sinter these oxides and they will only sinter at temperatures at which other cell constituent materials will be damaged, namely 1,700K.

Therefore, the methods currently in use for interconnector fabrication include, among others, (1) the method comprising forming thin films using a dry process such as CVD (chemical vapor deposition)-EVD (electrochemical vapor deposition) or flame spraying, (2) the method comprising forming individual films using a hot press, and (3) the method comprising forming individual films by sintering or cosintering using a sintering aid. Among these methods, the method of fabricating interconnectors by forming thin films on electrode materials such as $LaMnO_3$ (lanthanum manganate) type oxides or $Ni/ZrO_2$ (nickel/zirconia) thermet by CVD-EVD or flame spraying is currently the most practical method. Thin films formed by this method have a thickness much smaller as compared with films formed by sintering and therefore are advantageous in that even when $LaCrO_x$, which has a high electric resistance as compared with electrode materials, is used, the internal resistance of the cell can be reduced.

However, the CVD-EVD and flame spraying methods have the following disadvantages.
1. CVD-EVD method
   a) Being essentially a CVD process, it needs a mask formed directly on (and in close contact with) a substrate for forming a thin film on a portion of the substrate. The masking and demasking steps thus become complicated. In addition, the masking material, which is used at high temperatures and in a chloride vapor atmosphere, is limited to certain species.
   b) Continuous processing is impossible. The productivity of batchwise processing is poor.
   c) Any dopants other than Mg (magnesium) cannot be used.
2. Flame spraying method
   a) Pinholes are readily formed.
   b) Selective vaporization of component materials occurs and possibly causes the composition of the thin films obtained to deviate from the desired composition.

SUMMARY OF THE INVENTION

Accordingly, it is an object of the invention to solve the above problems and provide a method of producing interconnectors consisting of a compact thin film highly accurate in composition (without deviation from the desired composition) with high productivity.

The production method according to the invention is characterized in that a compact thin film to serve as an interconnector is formed on a substrate by laser ablation.

When strong pulse laser beams are focused on a target (e.g. $LaCrO_3$ type oxide), evaporation due to the heat absorbed and ablation due to the multiple photon absorption occur in the vicinity of the target surface, whereby the constituent elements are disintegrated and released in the form of atoms, molecules, ions and the like. The atoms, molecules, ions and the like that have sprung from the target surface during the above process are deposited on a substrate disposed face to face with said target, whereby a compact thin film capable of serving as an interconnector is formed.

$LaCrO_3$ type oxides are preferred as the thin film interconnector material. In particular, alkaline earth metal-doped $LaCrO_3$ type oxides can give thin films having good electrical conductivity. Furthermore, when the $LaCrO_3$ type oxides have an A site-to-B site composition ratio of 1:1 to 0.9:1, the thin films obtained show high chemical stability in the operating state.

For forming a thin film of an $LaCrO_3$ type oxide by laser ablation, the substrate is preferably heated at 700° to 1,050° C. When the substrate temperature is below 700° C., an amorphous thin film having a low electrical conductivity is obtained and when such film is heated to 1,000° C. or above after film formation, crystallization advances, causing the film to shrink and turn into a porous film. At excessively high substrate temperatures, the substrate readily deteriorates. Especially when an $LaMnO_3$ type oxide is used as the substrate material, the substrate temperature should preferably not exceed 1,050° C.

$LaMnO_3$ type oxides are preferred as the substrate material.

When the laser ablation technique is employed, the following advantages can be obtained.
1) Since that portion of the target which is bombarded with laser beams is disintegrated and released without changing its composition, the film composition hardly deviates from the target composition. Therefore, thin films having a desired composition can readily be obtained by using a target having the same composition as the desired film composition.
2) It is not necessary to bring a mask material into close contact with the substrate, masking and demasking are easy.
3) Continuous production becomes possible by using an air lock system, leading to improved productivity.
4) At a sufficiently high substrate temperature, ions and other particles diffuse on the substrate to some extent to give a stable crystal structure, so that pinhole-free compact thin films can be obtained.

Sr (strontium), Ca (calcium), Ba (barium) and the like can also be used as dopants, so that the coefficient of thermal expansion can be approximated to that of YSZ as compared with the case of magnesium-doped lanthanum chromium oxide $[La(Mg)CrO_x]$ thin film formation by CVD-EVD.

As mentioned hereinabove, the method of this invention makes it possible to produce interconnectors con-

DETAILED DESCRIPTION OF PREFERRED EMBODIMENTS

The following examples illustrate the invention in further detail but are by no means limitative of the scope of the invention.

EXAMPLE 1

Figure 1:
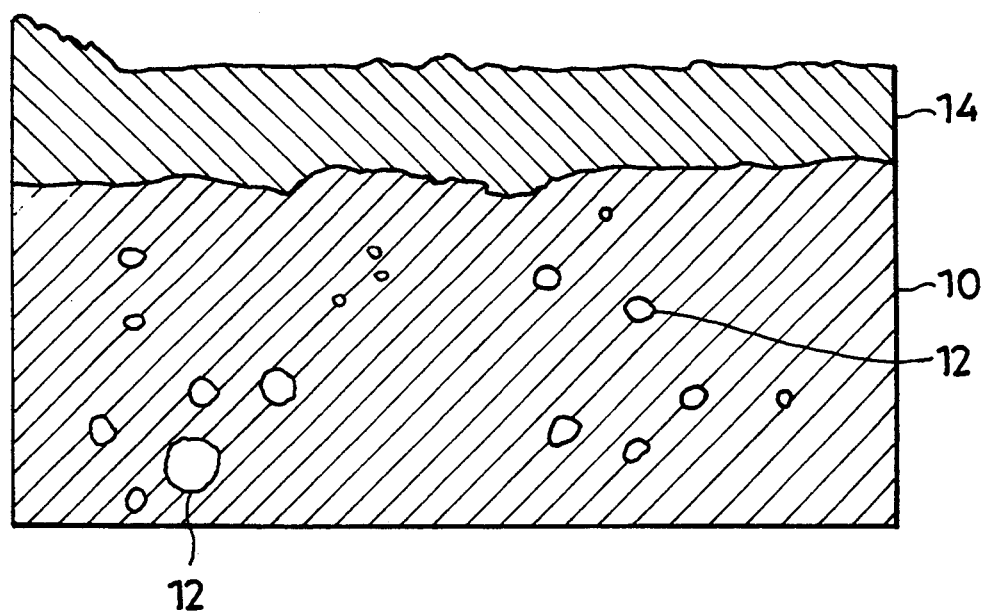
FIG. 1 is a schematic representation of a sectional view of a thin film obtained in an embodiment of the invention as observed on a scanning electron microscope (SEM), the magnification being 10,000 times.
Figure 2:
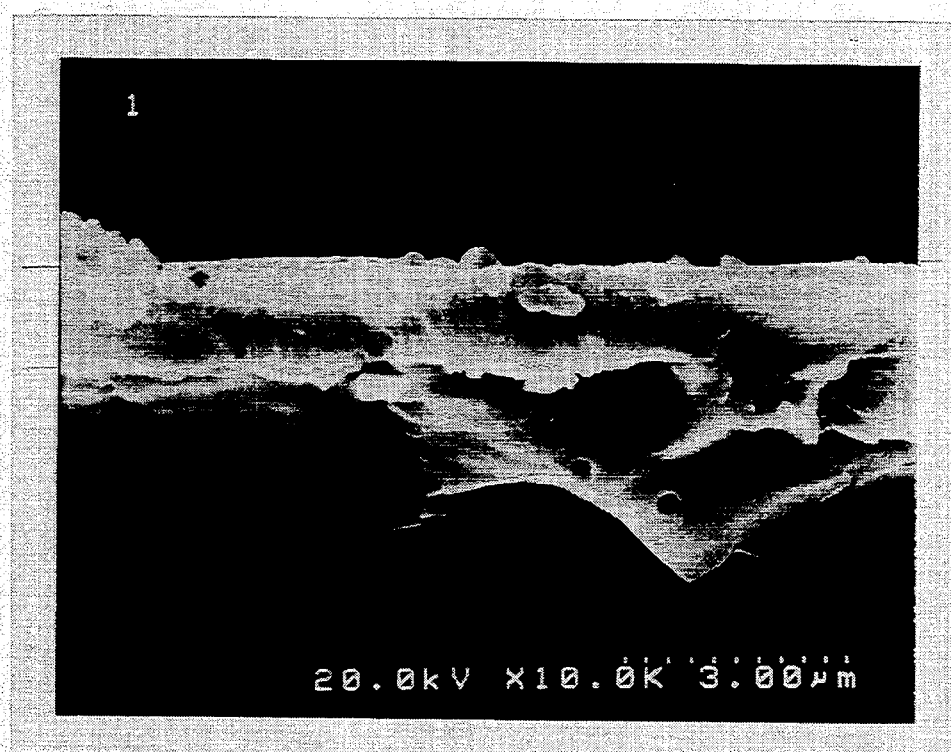
FIG. 2 is a photomicrograph ($\times 10,000$) taken on an SEM which corresponds to the schematic sectional view shown in FIG. 1.

On a strontium-doped lanthanum manganate [La(Sr)MnO$_{3\pm\delta}$] substrate heated at 850° C. was formed an interconnector thin film having a thickness of about 1.2 μm by the laser ablation method using a target having the composition La$_{0.85}$Sr$_{0.15}$CrO$_{3\pm\delta}$(Strontium-doped lanthanum chromium oxide) and an ArF excimer laser. Observation on an SEM (scanning electron microscope) revealed that the section of the thin film had a very compact structure. In FIG. 1, 10 stands for the substrate, 12 for a void in the substrate, and 14 for the thin film.

For evaluating the compactness of the thus-formed strontium-doped lanthanum chromium oxide thin film, a portion of the substrate was dissolved in HCl (3 to 5N) to give a portion consisting solely of the strontium-doped lanthanum chromium oxide. The latter portion was subjected to leak test under a pressure of 0.01 kg/cm$^2$, whereby no leak was observed and thus the thin film was found to be airtight. Further, after complete removal of the substrate to leave the thin film alone, the thin film was dissolved in a mixed solution containing HCl and HClO$_4$, followed by composition analysis by plasma emission spectrophotometry. The composition found was in agreement with the composition of the target within the range of analysis error (about 1%).

A solid oxide electrolyte fuel cell was constructed using the interconnector thin film obtained. The internal resistance of the cell was low.

EXAMPLE 2

On an yittria-stabilized zirconia (YSZ) substrate heated at 700° C. was formed a thin film, about 2 μm in thickness, by the laser ablation method using a target having the composition La$_{0.84}$Sr$_{0.15}$CrO$_{3\pm\delta}$ and an ArF excimer laser. This thin film was dissolved, together with the substrate, in a mixed solution containing HCl, HNO$_3$ and HClO$_3$ and the solution was analyzed by plasma emission spectrophotometry. The composition of the thin film was found to be La$_{0.84}$Sr$_{0.15}$CrO$_{3\pm\delta}$, which was in good agreement with the composition of the target.

We claim:

1. A method of producing interconnectors for solid oxide electrolyte fuel cells comprising:
    placing a target made of an alkaline earth metal-doped LaCrO$_3$ oxide face to face with a substrate, said alkaline earth metal-doped LaCrO$_3$ oxide having an A site-to-B site composition ratio of 1:1 to 0.9:1;
    heating said substrate to a temperature between 700° and 1,050° C.; and
    focusing strong pulse laser beams on said target, thereby depositing elements of said target on said substrate for forming a thin film of an alkaline earth metal-doped LaCrO$_3$ oxide on said substrate.

2. A method as claimed in claim 1, wherein said substrate is made of an LaMnO$_3$ oxide.

3. A method of producing interconnectors for solid oxide electrolyte fuel cells comprising:
    placing a target face to face with a substrate;
    heating said substrate to a temperature between 700° and 1,050° C.; and
    focusing strong pulse laser beams on said target, thereby depositing elements of said target on said substrate for forming a thin film on said substrate, said thin film and said target being a same material.

4. A method as claimed in claim 3, wherein the interconnector thin film is made of an LaCrO$_3$ oxide.

5. A method as claimed in 3, wherein the substrate is made of an LaMnO$_3$ oxide.

6. A method of producing interconnectors for solid oxide electrolyte fuel cells comprising:
    placing a target made of an LaCrO$_3$ oxide face to face with a substrate, said LaCrO$_3$ oxide having an A site-to-B site composition ratio of 1:1 to 0.9:1;
    heating said substrate to a temperature between 700° and 1,050° C.; and
    focusing strong pulse laser beams on said target, thereby depositing elements of said target on said substrate for forming a thin film of an LaCrO$_3$ oxide on said substrate.

7. A method as claimed in 6, wherein the substrate is made of an LaMnO$_3$ oxide.

* * * * *